United States Patent [19]

Cave et al.

[11] 3,896,393

[45] July 22, 1975

[54] MONOLITHIC POWER AMPLIFIER CAPABLE OF OPERATING CLASS A AND CLASS AB

[75] Inventors: David L. Cave, Mesa; Walter R. Davis, Tempe, both of Ariz.

[73] Assignee: Motorola, Inc., Chicago, Ill.

[22] Filed: Dec. 26, 1973

[21] Appl. No.: 428,519

[52] U.S. Cl. .................. 330/22; 330/13; 330/38 M; 330/207 P

[51] Int. Cl. .............................................. H03f 3/04

[58] Field of Search ......... 330/11, 13, 22, 15, 38 M, 330/207 P

[56] References Cited

UNITED STATES PATENTS

| | | | |
|---|---|---|---|
| 3,611,170 | 10/1971 | Wheatley | 330/13 |
| 3,629,717 | 12/1971 | Bisgaard | 330/13 X |
| 3,739,292 | 6/1973 | Furuhashi | 330/13 X |

OTHER PUBLICATIONS

Bailey, "30-Watt High Fidelity Amplifier," *Wireless World*, May 1968, pp. 94–98.

*Primary Examiner*—James B. Mullins
*Attorney, Agent, or Firm*—Vincent J. Rauner; Maurice J. Jones, Jr.; Michael D. Bingham

[57] ABSTRACT

The disclosed power amplifier is capable of selectively operating Class A and Class AB while being powered by a single power supply and does not develop undesirable crossover distortion while being powered by a dual power supply. The amplifier includes a first output transistor which is rendered conductive in response to driving signal portions of one polarity to supply current to an electrical load and a second output transistor which is rendered conductive by driving signal portions of the other polarity. A bias network is connected with the two output transistors of the amplifier. A driver circuit applies the driving signal to the bias network and to the first transistor. The bias network responds to the driving signal magnitude crossing a selected threshold to render the second transistor nonoperative and to bias the first transistor Class A. Consequently, the first transistor can then drive the output signal to either a greater or a lower level than otherwise would be possible. The amplifier circuit also includes a buffer stage, which prevents undesired distortion as the amplifier switches from Class AB to Class A operation, and short circuit protection.

10 Claims, 2 Drawing Figures

MONOLITHIC POWER AMPLIFIER CAPABLE OF OPERATING CLASS A AND CLASS AB

BACKGROUND OF THE INVENTION

It is sometimes desirable to provide electronic amplifier circuits in integrated form because of the resulting reductions in cost, size and weight and because of the resulting increases in reliabilty and, in some cases, circuit performance. Monolithic integrated circuit amplifiers are often required to have quiescent output levels which lend themselves to direct coupling to subsequent stages included on the same chip to thereby eliminate the need for external coupling capacitors and to reduce the number of package leads. It is also sometimes desired that such amplifiers provide output signals capable of reaching ground potential when powered by either single or dual supplies to render external load devices nonconductive. Monolithic power amplifiers are also often required to include short circuit current protection and to operate efficiently from either both dual or single power supplies.

Most prior art amplifiers, whether monolithic or discrete, have problems when required to operate from single and dual power supplies. Single power supplies provide only two power supply potentials and dual supplies provide three power supply potentials comprised of a positive level, a negative level and an intermediate or ground level.

More particularly, in Class A operation, the steady state or quiescent operating point of an amplifier is set at a midlocation on the static charateristics and the input signal excursions drive the output signal uniformly above and below this point. Class A operation of a transistor indicates that the collector current of the transistor is not cut off for any portion of an input signal cycle. Although Class A amplifiers provide a desired output signal excursion range when used with single supplies, such amplifiers have a limitation in that the output voltages thereof cannot be pulled to both the most positive and the most negative of the power supply potentials, provided by a dual power supply. This is because such amplifiers normally cannot both sink and source current with respect to a load connected between the amplifier output terminal and the intermediate or ground potential of a dual supply. Thus, a Class A amplifier including an NPN transistor usually cannot provide an output signal excursion extending to the negative power supply level. Because of their low power efficiency, Class A amplifiers are usually not employed as power amplifiers.

In Class B operation, the steady state or quiescent operating point is set at the nonconductive point of the static characteristics. The output signal current flows through the output devices of Class B amplifiers only when input signal current is applied. Class B operation of a transistor amplifier indicates that the collector current is cut off for one half cycle of the applied input signal waveform. Two transistors operating Class B push-pull alternate their conduction and cut off periods.

When compared with Class A amplifiers, Class B amplifiers offer the advantage of higher power efficiency. During periods of low or zero signal input, the power supply drain and transistor dissipation of Class B amplifiers are low which is a great asset both for battery supplies and when minimum heat generation is required. The disadvantage with respect to Class A are that Class B amplifiers tend to provide crossover distortion near the ground or load reference level and generally require more components. The crossover distortion problem is sometimes cured by providing additional base-to-emitter bias on the transistors of the Class B amplifier so that the amplifier operates Class AB. Class AB operation is different from Class A operation in that Class AB amplifiers will sink and source current with respect to the load when operated from a dual supply.

Although Class AB amplifiers are normally operated from dual power supplies, they can be operated from single supplies. Most Class AB amplifiers, however, have an undesirable limitation in that they are not capable of swinging their output voltages all the way to the ground level when operated from a single supply because of saturation and base-to-emitter voltage drops developed across devices thereof connected effectively in series with the electrical load. Prior art Class AB amplifiers which can swing their output voltage to ground when operated from a single supply tend to have crossover distortion when operated from a dual supply.

SUMMARY OF THE INVENTION

One object of this invention is to provide an improved amplifier circuit.

Another object of this invention is to provide an amplifier circuit configuration which develops a maximized output voltage excursion when operating from either a dual power supply or a single power supply.

Still another object of this invention is to provide an amplifier configuration which is capable of selectively operating Class A and Class AB while being powered from a single power supply and doesn't develop crossover distortion while being powered by a dual power supply.

A further object of this invention is to provide an amplifier configuration which is suitable for manufacture in monolithic integrated circuit form.

A still further object of this invention is to provide an amplifier configuration having a quiescent output voltage level which is suitable for direct coupling to an electrical load.

An additional object is to provide an efficient power amplifier configuration having an output voltage which can substantially reach the ground level when powered by either a single or a dual power supply and which has short circuit protection.

The amplifier circuit of the invention is suitable for providing an output signal having a maximum excursion across a load in response to an input signal having portions of first and second polarities. The amplifier includes first and second output transistors, a bias network and a driver circuit. The first output transistor is connected to the load and is rendered conductive in response to input signal portions of the first polarity. The second output transistor is coupled to the load and is rendered conductive in response to the input signal portions of the second polarity. The bias network, which is connected to the first and second output transistors and to the driver circuit, normally biases the output transistors for Class AB operation. The driver circuit receives the input signal and amplifies it to develop a drive signal which is coupled to the first output transistor and to the bias network. The bias network responds to the instantaneous magnitude of the driving signal being greater than a first threshold to render the second output transistor nonoperative so that the first output transistor can drive the output signal across the load to a predetermined level. Thus, the bias network biases the first output transistor Class A to thereby develop an output signal having a maximized excursion. The amplifier includes short circuit protection and is suitable for manufacture in monolithic form.

DETAILED DESCRIPTION OF THE PREFERRED EMBODIMENT

Figure 1:
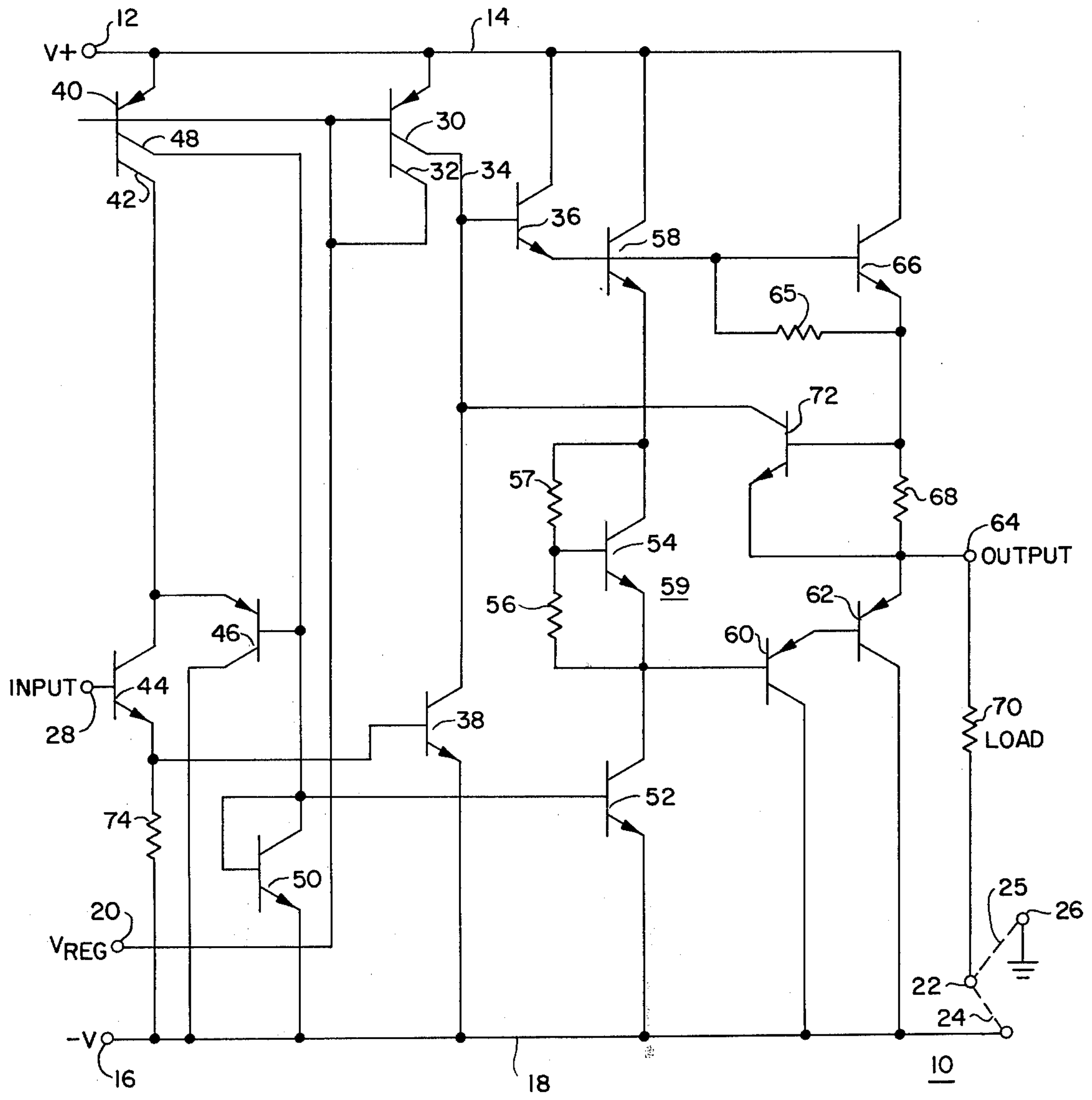
FIG. 1 is a schematic diagram of a circuit of one embodiment of the invention.

Amplifier circuit 10 of FIG. 1 is suitable for being utilized in a multiplicity of different applications which heretofore have been performed by different amplifier configurations each having a different class of operation. Amplifier 10 includes power supply terminal 12 which is adapted to be connected between an external voltage source and positive power supply conductor 14, which applies a positive power supply voltage to some of the components of amplifier 10. Negative power supply terminal 16 is adapted to be connected between an external power supply terminal providing a potential that is negative with respect to the potential applied to power supply 12 and negative power supply conductor 18, which distributes the negative power supply voltage to other components of amplifier 10. Bias terminal 20 is adapted to receive a regulated, constant bias potential which is between the positive potential applied to terminal 12 and the negative potential applied to terminal 16. The intermediate potential is developed by any one of a plurality of known voltage regulator circuits which can be located on the same chip as amplifier 10. The bias voltage is applied to terminal 20 regardless of whether amplifier 10 is driven by a single power supply providing only two potentials or by a dual power supply providing three potentials. If a single power supply is used, then load terminal 22 is connected to conductor 18 as indicated by dashed line 24. Alternatively, if a dual power supply is utilized then load terminal 22 is connected to power supply terminal 26 providing the intermediate or ground power supply potential, as indicated by dashed line 25. Input terminal 28 is adapted to receive an input signal either from circuitry located on the same chip as amplifier 10 or from some other signal source. The input signal, for instance, may be an audio frequency signal.

Amplifier Start Up

Transistor 30 is a dual collector transistor having an emitter electrode connected to power supply conductor 14 and a collector electrode 32 connected back to its base electrode. Collector electrode 34 is connected to the base of emitter follower amplifier transistor 36 which is connected to the collector of amplifier transistor 38. The collector-base connection of transistor 30, in effect, forms a diode between the base of transistor 30 and its emitter. Consequently, under start up condition transistor 30 initially responds to the regulated voltage applied to terminal 20 and to the positive voltage applied to power supply conductor 14 to supply a current to the collector of transistor 38 and to the base of transistor 36.

The regulated bias voltage is also applied to the base of dual collector transistor 40. Consequently, under initial start up conditions current is delivered by collector 42 to the collector of amplifier transistor 44 and to the emitter of transistor 46. A current is also delivered by collector 48 through diode connected transistor 50 to negative supply conductor 18. Diode connected transistor 50 then biases up current source transistor 52. The ratio of the emitter areas of transistors 50 and 52 can be selected to establish a desired ratio between the collector currents of transistors 50 and 52. Transistors 50 can be designed to operate at a lower current than transistor 52 thereby reducing the power supply current drain over what it would be if transistor 50 had the same emitter area as transistor 52. PNP dual collector transistors 30 and 40 may be lateral transistors of known structure.

Next, the collector of transistor 52 draws current through "N$\phi$ bias network" 59 which includes transistor 54 that has resistor 56 connected between its base and emitter electrodes and resistor 57 connected between its base and collector electrodes. The collector electrode of transistor 54 is connected to the emitter electrode of buffer transistor 58 which includes a base electrode connected to the emitter electrode of transistor 36 and a collector electrode connected to power supply conductor 14. In response to the current drawn by transistor 52 and the positive voltage applied to its collector, transistor 54 is rendered conductive and generates a base-to-emitter voltage which is designated by the symbol "$\phi$" between its base-to-emitter. Since resistor 56 is connected across the base-to-emitter of transistor 54, it also then has a voltage of 1$\phi$ established thereacross. The voltage across resistor 56, therefore, may be on the order of seven-tenths of a volt. Since transistor 54 is a monolithic vertical NPN transistor having a relatively large beta, it may be assumed that its base current is insignificant as compared to the current flowing through resistor 56. The current flowing through resistor 56 must be supplied by resistor 57. If resistor 57 is chosen to have a value which is N times the value of resistor 56 then N times the voltage developed across resistor 56 must be developed across resistor 57 by their common current. Since the voltage across resistor 56 is 1$\phi$ and the voltage across resistor 57 is N$\phi$, then a voltage of $(N+1)\phi$ must be developed between the collector and emitter electrodes of transistor 54. Consequently, transistor 54, resistor 56 and resistor 57 form what is commonly referred to as a "$(N+1)\phi$" bias network.

Output PNP transistors 60 and 62 are connected in a Darlington configuration between the collector of transistor 52 and output terminal 64. Output NPN transistor 66 includes a collector electrode which is connected to positive power supply conductor 14, a base electrode which is connected to the base electrode of transistor 58, and an emitter electrode which is connected through resistor 68 to output terminal 64. Transistor 66 is rendered conductive in response to alternate half cycles of the input signal and Darlington connected transistors 60 and 62 are rendered conductive in response to the other alternate half cycles of the input signal. Load 70 may be a loudspeaker, for instance. Bias network 59 and transistor 58 provide a quiescent base-to-emitter bias voltage to NPN output transistor 66 and to PNP output Darlington transistors 60 and 62. This bias voltage normally operates amplifier 10 Class AB to prevent crossover distortion and facilitates direct coupling to active loads which could be connected to terminal 64 in place of load resistor 70.

Short Circuit and Overload Protection

The configuration of amplifier 10 provides overload and short circuit protection in case amplifier output terminal 64 is directly connected to either positive power supply conductor 14 or negative power supply conductor 18. If output terminal 64 is directly connected to power supply conductor 18 or if a signal overload occurs, then a large quantity of current is drawn or sourced through transistor 66 and resistor 68 to the negative power supply terminal 16. Overload protection transistor 72 includes a base electrode connected to one end of current sensing resistor 68, an emitter electrode connected to output terminal 64 and a collector electrode connected to the base electrode of drive transistor 36 and to collector electrode 34 of transistor 30. The value of resistor 68 is chosen such that when the magnitude of the current therethrough becomes excessive, transistor 72 is rendered conductive and deprives transistor 36 of its base drive. Consequently, transistors 58 and 66 are rendered nonconductive to thereby prevent excessive currents from being drawn through output NPN transistor 66 which could render amplifier 10 permanently disabled.

Alternatively, if output terminal 64 is connected to power supply terminal 12 or if a single overload condition exists, transistor 62 tends to conduct or sink too much current. The configuration of amplifier 10 tends to limit the maximum amount of current which can be sinked from load 70. As previously described, diode 50 in combination with transistor 52 form a constant current source which draws a fixed maximum amount of current through the collector of transistor 52. Thus, assuming that transistor 38 is nonconductive, the maximum current which can be sinked by amplifier 10 is limited to the maximum current of transistor 52 multiplied by the product of the betas of transistors 60 and 62. Hence, by carefully choosing the current of transistor 52, the amplifier can be partially protected.

If a positive going input signal is applied to the base of transistor 44 and output terminal 64 is directly connected to the positive supply, then amplifier 10 provides a different mode of protection. More specifically, a positive voltage at input terminal 28 results in a positive voltage being applied to the base electrode of transistor 38. Consequently, transistor 38 is rendered conductive and lowers the voltage at the collector of transistor 72. Consequently, it is possible for the positive voltage at output terminal 64 to forward bias the base-to-collector junction of transistor 72 which then tends to provide excessive currents which could permanently damage transistors 38 and 72. Transistors 38 and 72 are protected by limiting the base drive available to transistor 38. More specifically, the current source including transistor 40 is designed such that the maximum output current at collector 42 is less than what would be required to allow transistor 38 to develop sufficient base-to-emitter bias to damage transistors 38 and 72. Transistor 46 conducts the portion of the constant current delivered through collector 42 of transistor 40 which is not demanded by transistor 44 during operation of the amplifier. Thus, the configuration of amplifier 10 protects against signal overload and the connection of output terminal 64 to either positive power supply terminal 12 or to the negative power supply terminal 16 regardless of the state of the input signal.

AC Operation

Figure 2:
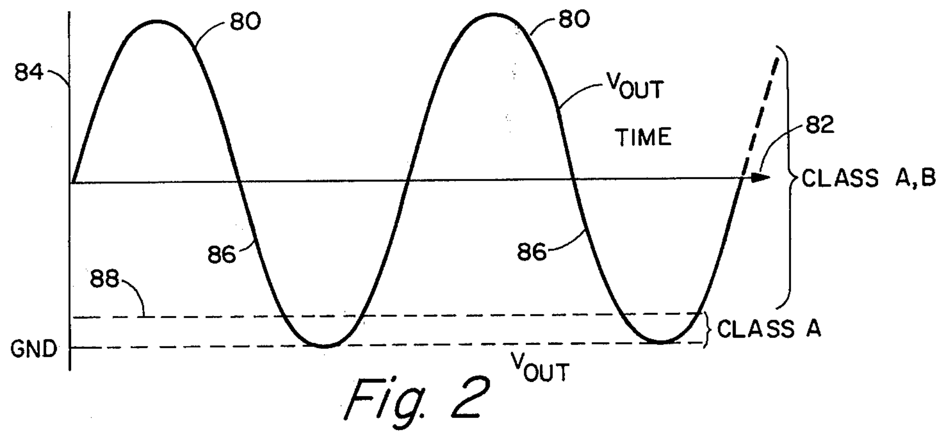
FIG. 2 is an output signal waveform which is useful in illustrating the classes of operation of the amplifier circuit of FIG. 1.

If a single power supply is connected to amplifier 10, terminal 22 of load 70 then is connected to conductor 18, as indicated by dashed line 24. Transistor 44 may be biased by any one of a plurality of known networks to operate Class A. An AC input signal applied to input terminal 28 tends to render transistor 44 more conductive during its alternate positive excursions and less conductive during its negative excursions to thereby provide a noninverted signal across load resistor 74, which is connected from the emitter electrode of transistor 44 to power supply conductor 18. Transistor 38 which is biased Class A by the current through resistor 74, amplifies and inverts the signal across resistor 74 and applies it to the base electrode of driver transistor 36. Positive excursions of the further amplified driving signal developed by transistor 36 tend to render output transistor 66 more conductive which provides or sources an increased amount of current through resistor 68 to load resistor 70. Consequently, in response to negative excursions of the input signal, positive output signal portions 80, which are shown in FIG. 2, are developed across load 70. Abscissa axis 82 of FIG. 2 indicates time and ordinate axis 84 of FIG. 2 indicates the relative magnitude of the output signal.

More specifically, as previously mentioned, the base-to-emitter voltage of transistor 58, the bias voltage developed by N$\phi$ bias network 59 provide a substantially constant bias voltage to transistor 66 and transistors 60 and 62. As the forward bias on transistor 66 increases, it tends to absorb more of the constant bias voltage thereby leaving less for Darlington connected transistors 60 and 62. Hence, transistors 60 and 62 tend to be rendered less conductive and transistor 66 tends to be rendered more conductive in response to positive going signals at the base of transistor 36. Alternatively, as the magnitude of the signal at the base of transistor 36 swings in a negative direction, as indicated by portions 86 of the waveform of FIG. 2, transistor 66 is rendered less conductive and transistors 60 and 62 are rendered more conductive by the constant bias voltage so that the output voltage across load 70 tends to become more negative. The load resistance for amplifier 10 is generally specified to be large enough to prevent transistors 60 and 62 from being rendered completely nonconductive during the positive excursions 80 of the output waveform. Transistors 60 and 62, which may be substrate PNP transistors of known configurations, each have betas on the order of 10 to provide approximately the same amount of gain as NPN transistor 66, which could have a beta on the order of a hundred. If amplifier 10 is provided in discrete form, Darlington PNPs 60 and 62 could be replaced by a single PNP transistor having a beta which is approximately equal to the beta of NPN transistor 66.

Class AB and Class A Operation

As the output signal of amplifier 10 becomes more and more negative, eventually the magnitude of the voltage at the emitter of transistor 36 decreases to where it equals the sum of the base-to-emitter voltage of transistor 58, plus the voltage developed across N$\phi$ network 59, plus the saturation voltage of transistor 52.

Under these conditions, the output voltage level as indicated by dashed line 88 of FIG. 2 is approximately equal to the saturation voltage of transistor 52, plus the voltage across Nφ network 59, plus the base-to-emitter voltage of transistor 58, minus the base-to-emitter voltage of transistor 66. As the input voltage demands that the output voltage swing to a still lower potential, the voltage at the base of transistor 36 decreases slightly and crosses a threshold which causes the bias voltage developed across bias network 59 to rapidly collapse. In other words, the voltage at the emitter of transistor 36 becomes so low that it can no longer sustain the base-to-emitter voltage required by transistor 54. Thus, the base-to-emitter voltages across Darlington transistors 60 and 62 are no longer sustained. Hence, the amplifier switches from a Class AB operation over to a Class A operation. Since transistor 66 can be driven to a completely nonconductive state, it is possible for the voltage at terminal 64 and across load 70 to closely approach the negative supply voltage delivered by conductor 18, which maximizes the possible excursion of the output signal. Under the foregoing conditions, the base-to-emitter voltages of transistors 36 and 66 are maintained. Consequently, there is adequate voltage applied across transistor 38 to sustain its operation as an active device. As the output voltage develops a positive slope and returns through threshold 88, the amplifier switches from a Class A operation back to Class AB operation due to the re-energization of bias network 59. The ability of amplifier 10 to switch from a Class AB to a Class A and then back to a Class AB mode of of operation is a significant aspect of the invention because it enables the output voltage to be driven to a near ground level by an efficient power amplifier operated by a single supply.

Transistor 58 is also a significant aspect of the invention because it tends to buffer the drive signal at the base of transistor 66 from the rapid voltage and current changes occurring at its emitter electrode so that the output signal remains distortion free even as it traverses back and forth across threshold 88. Transistor 36 buffers the drive of transistor 38 from the transients occurring across transistors 54, 52, 60 and 62 by a factor of beta. The ability of amplifier 10 to drive all the way to ground is facilitated by the "upper-drive" provided by transistors 36 and 58. Applicant believes that most prior art amplifiers include current sources in place of transistor 36 and use "lower-drive" at the base of transistor 52.

If amplifier 10 is operated from a dual power supply, then load terminal 22 is connected to the ground or intermediate potential terminal, as indicated by dashed line 25. Under dual supply conditions the amplifier normally operates Class AB all of the time. Bias network 59 prevents the amplifier of FIG. 1 from having undesirable amounts of crossover distortion. Although some prior art amplifiers will drive to ground under single supply operating conditions, such prior art amplifiers develop undesired amounts of crossover distortion when utilized in dual supply operation. Such crossover distortion is particularly detrimental when such prior art amplifiers are utilized in high fidelity audio applications.

One embodiment of amplifier circuit 10, which when built and tested operated in a satisfactory manner, included the following component values:

| | |
|---|---|
| Resistor 74 | 60 kilo-ohms |
| Resistor 58 | 32 kilo-ohms |
| Resistor 56 | 37 kilo-ohms |
| Resistor 65 | 40 kilo-ohms |
| Resistor 68 | 25 ohms |
| Load resistor 70 | 2 kilo-ohms |
| Capacitor 87 | 100 picofarads |

What has been disclosed, therefore, is an improved amplifier configuration which is suitable for manufacture in either discrete or integrated circuit form. The amplifier configuration develops a maximum output voltage excursion across a load when operated by either dual or single power supplies. While being powered from a single power supply, the amplifier selectively operates between Class A and Class AB and while being powered from a dual power supply does not develop crossover distortion. The output voltage developed at output terminal 64 is capable of approaching the ground or negative supply level when the amplifier is operated by either a dual or a single supply. This result is advantageous because it enables output load devices such as a load transistor, for instance, to be driven to cut off. Moreover, the amplifier configuration in addition to providing maximum signal excursion also includes short circuit and overload protection, facilitates d.c. coupling and provides high power efficiency amplification. It is contemplated that after having studied the above description of the preferred embodiment, those skilled in the art could foresee certain alterations and modifications which have not been pointed out with particularity herein. Accordingly, this disclosure is intended as being in the nature of an explanatory illustration only and it is in no way to be considered as limiting. Therefore, the appended claims are to be interpreted as including all modifications which fall within the true spirit and scope of the invention. While specific types and values of components and semiconductor devices have been disclosed for exemplary purposes, it should be understood that a variety of components and devices could be utilized by those skilled in the art.

We claim:

1. A class AB-class A amplifier circuit suitable for providing an output signal having a maximized excursion across a load in response to an input signal having portions of first and second polarities, including in combination:

first electron control means connected to the load, said first electron control means being rendered conductive in response to the portions of the input signal of the first polarity to source current to the load;

second electron control means coupled to the load, said second electron control means being rendered conductive in response to the portions of the input signal of the second polarity;

bias network means connected to said second electron control means;

driver circuit means having an input terminal adapted to receive the input signal and having an output terminal coupled to said first electron control means, said driver circuit means providing a driving signal at said output terminal thereof;

said bias network means being responsive to the magnitude of portions of the driving signal crossing a first threshold to render said second electron control means non-operative so that said first electron control means can drive the output signal across the load to a predetermined level and thereby develop the output signal having the maximized excursion; and buffer means being connected between said bias network means, said driver circuit means and said first electron control means for severely limiting distortions in the output signal thereof as said bias network means renders said second electron means non-operative.

2. The amplifier circuit of claim 1 wherein said first electron control means includes an NPN bipolar transistor, said second electron control means includes a PNP bipolar transistor, and said buffer means includes a NPN bipolar transistor.

3. The amplifier circuit of claim 2 wherein said second electron control means includes two PNP transistors which are connected to each other in a Darlington manner.

4. The amplifier circuit of claim 1 further including:

a first power supply conductor adapted to provide a power supply voltage of a first polarity, said first power supply conductor being coupled to said first electron control means and to said bias network means, and to said buffer means;

a second power supply conductor adapted to provide a power supply voltage of the second polarity, said second power supply conductor being coupled to the load, to said second electron control means, and to said bias network means; and said bias network means being rendered inoperative in response to the magnitude of said driving signal crossing said first threshold to thereby remove bias from said second electron control means so that said first electron control device can cause a voltage to be developed across the load which approaches the power supply voltage provided by said second power supply conductor.

5. The amplifier circuit of claim 1 wherein said bias network means includes:

bipolar transistor means having a first electrode connected to said second electron control means, a second electrode connected to said buffer means, and a control electrode;

first resistive means connected between said first electrode and said control electrode; and second resistive means connected between said second electrode and said control electrode.

6. A Class AB-Class A power amplifier circuit suitable for being manufactured in monolithic integrated circuit form and for providing a distortion-free signal of maximum excursion across a load connected to the amplifier output terminal, including in combination:

a first power supply conductor adapted to provide a power supply voltage of a first polarity;

a second power supply conductor adapted to provide a power supply voltage of a second polarity, said second power supply conductor being connected to a first terminal of the load;

driver circuit means including first electron control means said first electron control means having a second electrode coupled to said first power supply conductor, a control electrode coupled to an input terminal thereof to receive an input signal and a first electrode connected to said second power supply conductor, said driver circuit means providing a driving signal at an output terminal thereof in response to said input signal;

second electron control means having a second electrode connected to said first power supply conductor, a control electrode connected to said output terminal of said driver circuit means, and a first electrode;

bias network means having a first terminal, a second terminal and a third terminal, said third terminal connected to said second power supply conductor;

first circuit means connecting said first electrode of said second electron control means to the amplifier output terminal said output terminal being connected to a second terminal of the load;

third electron control means having a first electrode connected to the amplifier output terminal, a second electrode connected to said second power supply conductor, and a control electrode connected to said second terminal of said bias network means;

first buffer means connected between said first terminal of said bias network and said output terminal of said driver circuit means and having an additional connection to said first power supply conductor for buffering said second electron control means from transients occurring when said third electron control means is rendered inoperative to severely limit distortion in said voltage at the amplifier output terminal as said drive signal crosses said predetermined threshold; and said bias network means being responsive to the magnitude of said drive signal at said output terminal of said driver circuit means crossing a predetermined threshold to render said third electron control means inoperative so that said second electron control means can drive the voltage at the amplifier output terminal to the maximum excursion level approaching the second power supply potential.

7. The amplifier circuit of claim 6 wherein said driver circuit means further includes fourth electron control means having a first electron connected to said output terminal of said driver circuit means, a second electrode connected to said first power supply conductor, and a control electrode connected to said second electrode of said first electron control means, said fourth electron control means buffering said first electron control means from transients occurring when said third electron control means is rendered inoperative.

8. The amplifier circuit of claim 7 wherein said first circuit means includes:

first resistive means connected from said first electrode of said second electron control means to the amplifier output terminal;

other electron control means having a control electrode connected to said first electrode of said second electron control means, a first electrode connected to the amplifier output terminal and a second electrode connected to said control electrode of said fourth electron control means; and said other electron control means being responsive to a voltage across said first resistive means exceeding a predetermined value to provide a control voltage to said control electrode of said fourth electron control means which renders the amplifier nonoperating to thereby provide overload and short-circuit protection.

9. The amplifier circuit of claim 7 wherein said driver circuit means still further includes:

fifth electron control means having a first electrode, a second electrode, and a control electrode, said control electrode adapted to receive said input signal, said first electrode connected to said control electrode of said first electron control means;

second circuit means connected from said first electrode of said fifth electron control means to said second power supply conductor;

current supply means connected from said second electrode of said fifth electron control means to said first power supply conductor and having a first terminal connected to said second power supply conductor, said current supply means providing a limited amount of current to said fifth electron control means to provide overload and short-circuit protection; and first resistive means connected from said control electrode of said second electron control means to said first electrode of said second electron control means.

10. The amplifier circuit of claim 9 wherein each of said electron control means include a bipolar transistor.

* * * * *